(12) United States Patent
Nariman et al.

(10) Patent No.: US 6,265,283 B1
(45) Date of Patent: Jul. 24, 2001

(54) SELF-ALIGNING SILICON OXYNITRIDE STACK FOR IMPROVED ISOLATION STRUCTURE

(75) Inventors: Homi E. Nariman; Sey-Ping Sun; H. Jim Fulford, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/373,217

(22) Filed: Aug. 12, 1999

(51) Int. Cl.$^7$ .................................................. H01L 21/76
(52) U.S. Cl. ............................................ 438/424; 438/437
(58) Field of Search ..................................... 438/424, 437, 438/435, 430, 433, 436

(56) References Cited

U.S. PATENT DOCUMENTS

| | | | |
|---|---|---|---|
| 5,258,332 | * 11/1993 | Horioka et al. | 438/424 |
| 5,578,518 | * 11/1996 | Koike et al. | 438/424 |
| 5,719,085 | * 2/1998 | Moon et al. | 438/435 |
| 5,976,948 | * 11/1999 | Werner et al. | 438/424 |
| 6,083,808 | * 7/2000 | Shin et al. | 438/435 |
| 6,180,466 | * 1/2001 | Ibok | 438/424 |

OTHER PUBLICATIONS

Stanley wolf and Richard N. Tauber; Silicon Processing for the VLSI Era, vol. 3—*The Submicron MOSFET*; pp. 409–413; 1995.

* cited by examiner

*Primary Examiner*—Michael Trinh
(74) *Attorney, Agent, or Firm*—Timothy M. Honeycutt

(57) ABSTRACT

Methods of fabricating an isolation structure on a substrate are provided. In one aspect, a method of fabricating an isolation structure on a substrate is provided that includes forming a first insulating layer on the substrate wherein the first insulating layer has a first sidewall. A trench is formed in the substrate that has a second sidewall. A second insulating layer is formed in the trench. The second insulating layer displaces the second sidewall laterally. The first insulating layer is densified by heating to liberate gas therefrom and thereby move the first sidewall into substantial vertical alignment with the second sidewall. The risk of substrate attack due to trench isolation structure pullback is reduced. Trench edges are covered by thick isolation material.

31 Claims, 4 Drawing Sheets

SELF-ALIGNING SILICON OXYNITRIDE STACK FOR IMPROVED ISOLATION STRUCTURE

BACKGROUND OF THE INVENTION

1. Field of the Invention

This invention relates generally to semiconductor fabrication, and more particularly to methods of fabricating an isolation structure.

2. Description of the Related Art

The implementation of integrated circuits involves connecting isolated circuit devices through specific electrical pathways. Where integrated circuits are implemented in silicon, it is necessary, therefore, to initially isolate the various circuit devices built into the silicon substrate from one another. The circuit devices are thereafter interconnected to create specific circuit configurations through the use of global interconnect or metallization layers and local interconnect layers.

Local oxidation of silicon ("LOCOS") and trench and refill isolation represent two heavily used isolation techniques for both bipolar and metal oxide semiconductor ("MOS") circuits. In a conventional semi-recessed LOCOS process, a thin pad oxide layer is thermally grown on a silicon substrate surface and coated with a layer of chemical vapor deposition ("CVD") silicon nitride. The active regions of the substrate are then defined with a photolithographic step. The nitride layer is then dry etched and the pad oxide layer wet or dry etched with the photoresist left in place to serve as a masking layer for a subsequent channel stop implant. After the channel stop implant, field oxide regions are thermally grown by means of a wet oxidation step. The oxidation of the silicon proceeds both vertically into the substrate and laterally under the edges of the nitride layer, resulting in the formation of structures commonly known as bird's beaks.

The formation of bird's beak structures is problematic in a number of ways. To begin with, bird's beak formation can create significant limitations on the packing density of devices in an integrated circuit. Design rules for LOCOS processes must restrict the gaps between adjacent devices to account for the lateral encroachment of bird's beaks. In addition, the very shape of a bird's beak can result in the exposure of the substrate surface during subsequent overetching to open contacts for metallization. This can result in the source of the transistor becoming shorted to the well region when the metal interconnect film is deposited. This problem may be particularly acute in CMOS circuits where shallower junctions are used, due to the higher propensity for the exposure of the well regions. While some improvement in the formation of bird's beak structures has occurred as a result of the introduction of techniques such as the etchback of portions of the field oxide structures, deposition of a silicon nitride layer without a pad oxide layer, and use of a thin pad oxide covered with polysilicon, the difficulties associated with bird's beak formation have not been completely eliminated.

In the fabrication of many trench based isolation structures, a damascene process is used to pattern and etch a plurality of trenches in the silicon substrate. The trenches are then refilled with a CVD silicon dioxide or doped glass layer that is planarized back to the substrate surface using etchback planarization or chemical mechanical polishing ("CMP"). In one conventional process, a stack consisting of a sacrificial oxide layer and low pressure CVD ("LPCVD") silicon nitride layer is formed in the substrate. The stack and the underlying substrate are then etched to define the isolation trench. The trench is formed with highly sloped sidewalls which are vertically aligned with the sidewalls of the overlying nitride layer. A thermally grown liner oxide layer is next formed in the trench in anticipation of the subsequent deposition of a insulating layer which will be planarized to yield the trench isolation structure. The oxidation process to form the liner oxide consumes some of the silicon substrate, resulting in the lateral movement of the trench sidewalls. However, the sidewalls of the overlying nitride layer remain fixed since the LPCVD nitride is relatively unaffected by the oxidation process. The result is a vertical misalignment between the sidewalls of the substrate in the trench and the sidewalls of the nitride layer.

A dielectric material is next blanket deposited on the nitride layer, filling the trench. The gap between the sidewalls of the nitride layer define the initial lateral dimension of the dielectric layer and the isolation structure formed therefrom. The dielectric layer is then planarized to the nitride layer and the nitride layer is stripped to yield the completed isolation structure. As a result of the misalignment of the sidewalls of the nitride layer and the silicon sidewalls in the trench, the edges of trench isolation structure are pulled back from the silicon sidewalls, leaving only a thin and relatively short birds' beak structure covering the substrate. These areas of the substrate are vulnerable to attack by a myriad of later cleaning and etching process, such as oxide etches, HF dips and sputter cleans. The amount of pullback may be increased where the trench isolation structure is composed of a material that densifies during subsequent high temperature steps.

The present invention is directed to overcoming or reducing the effects of one or more of the foregoing disadvantages.

SUMMARY OF THE INVENTION

In accordance with one aspect of the present invention, a method of fabricating an isolation structure on a substrate is provided that includes forming a first insulating layer on the substrate wherein the first insulating layer has a first sidewall. A trench is formed in the substrate that has a second sidewall. A second insulating layer is formed in the trench that displaces the second sidewall laterally. The first insulating layer is densified by heating to liberate gas therefrom and thereby move the first sidewall into substantial vertical alignment with the second sidewall.

In accordance with another aspect of the present invention, a method of fabricating an isolation structure on a substrate is provided that includes forming a first insulating layer on the substrate wherein the first insulating layer has a first sidewall. A trench is formed in the substrate with a second sidewall. A first oxide layer is formed in the trench that displaces the second sidewall laterally. The first insulating layer is densified by heating to liberate gas therefrom and thereby move the first sidewall laterally away from the trench and at least as far as the second sidewall.

In accordance with another aspect of the present invention, a method of fabricating an isolation structure on a substrate is provided that includes forming a silicon oxynitride layer on the substrate with a first sidewall. A trench is formed in the substrate with a second sidewall. A first oxide layer is formed in the trench. The first oxide layer displaces the second sidewall laterally. The silicon oxynitride layer is densified by heating to liberate nitrogen and oxygen therefrom and thereby move the first sidewall into substantial vertical alignment with the second sidewall.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
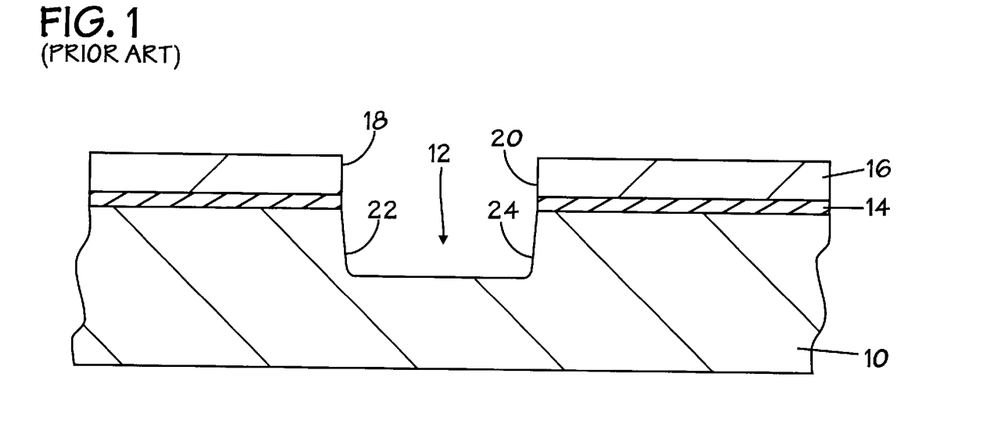
FIGS. 1–4 depict an exemplary conventional process for fabricating a trench isolation structure on a semiconductor substrate.

In the drawings described below, reference numerals are generally repeated where identical elements appear in more than one Figure. Turning now to the drawings, and in particular to FIGS. 1–4, there is depicted an exemplary conventional fabrication process for manufacturing an isolation structure. Turning initially to FIG. 1, therein is depicted a cross-sectional view of a semiconductor substrate 10 in which an isolation trench 12 has been formed by anisotropic etching. The substrate 10 is typically composed of lightly doped silicon. A pad oxide layer 14 is formed on the upper surface of the substrate 10, principally to protect the substrate 10 during various etch and thermal steps used to fabricate the isolation structures. A silicon nitride layer 16 is formed on the pad oxide layer 14 to a thickness of about 1500 to 2000 Å. As described more fully below, the silicon nitride layer 16 is designed to provide a robust temporary insulating layer that provides an etch and CMP resistant framework for the subsequent formation of an isolation structure in the trench 12.

Initially, the pad oxide layer 14 is fabricated on the substrate 10 by thermal oxidation or CVD, and the silicon nitride layer 16 is subsequently deposited by LPCVD. Thereafter, the silicon nitride layer 16 is appropriately masked and an anisotropic etch is performed through the silicon nitride layer 16, the pad oxide layer 14 and into the substrate 10 to define the trench 12. The mask is subsequently stripped to leave the structure depicted in FIG. 1.

Following the etch to define the trench 12, the opposing sidewalls 18 and 20 of the silicon nitride layer 16 are in respective relative vertical alignment with the vertical sidewalls 22 and 24 of the trench 12. As described more fully below, the nature of the conventional process is such that this relative vertical alignment between the sidewalls 18 and 20 of the layer 16 and the sidewalls 22 and 24 of the trench 12 is transitory.

Figure 2:
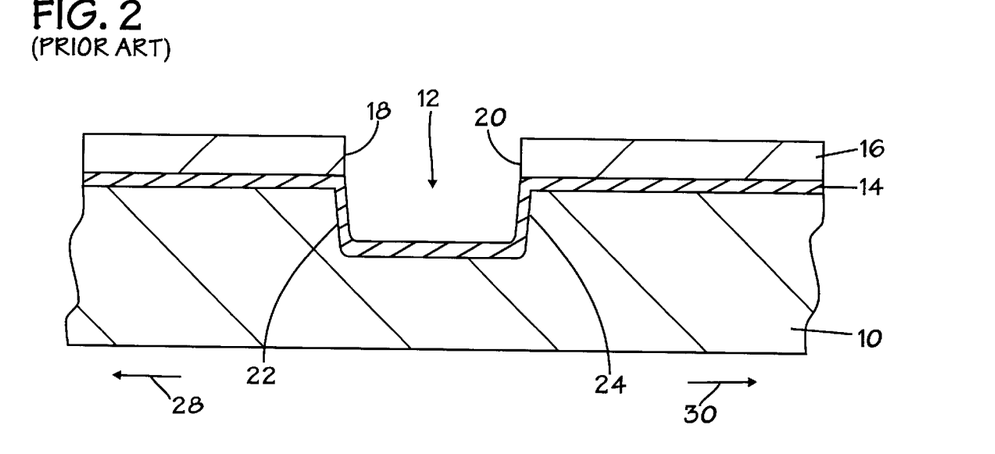

Referring now to FIG. 2, a liner oxide layer 26 is formed in the trench 12 by thermal oxidation. The liner oxide 26 is about 500 Å in thickness, and due to the silicon consumptive nature of the oxidation process, the formation of the liner oxide layer 26 consumes some of the silicon substrate 10. This results in a lateral movement of the sidewalls 22 and 24 as indicated by the respective arrows 28 and 30. This lateral movement of the sidewalls 22 and 24 results in a vertical misalignment between the sidewalls 18 and 20 of the silicon nitride layer 16 and the sidewalls 22 and 24 of the substrate 10.

Figure 3:
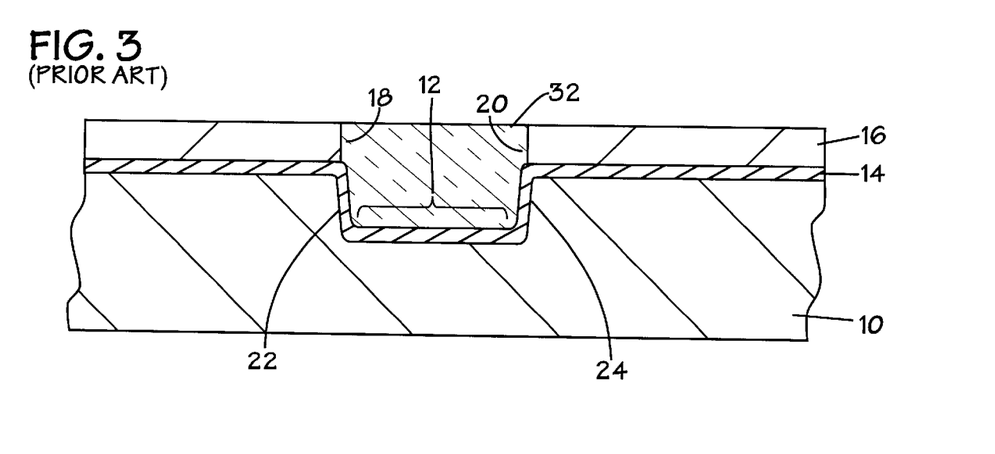

Referring now to FIG. 3, a layer of isolation material 32 is blanket deposited over the silicon nitride layer 16 and in the trench 12, and subsequently planarized to the silicon nitride layer 16. The isolation layer 32 is typically composed of doped glass, oxide or the like.

Figure 4:
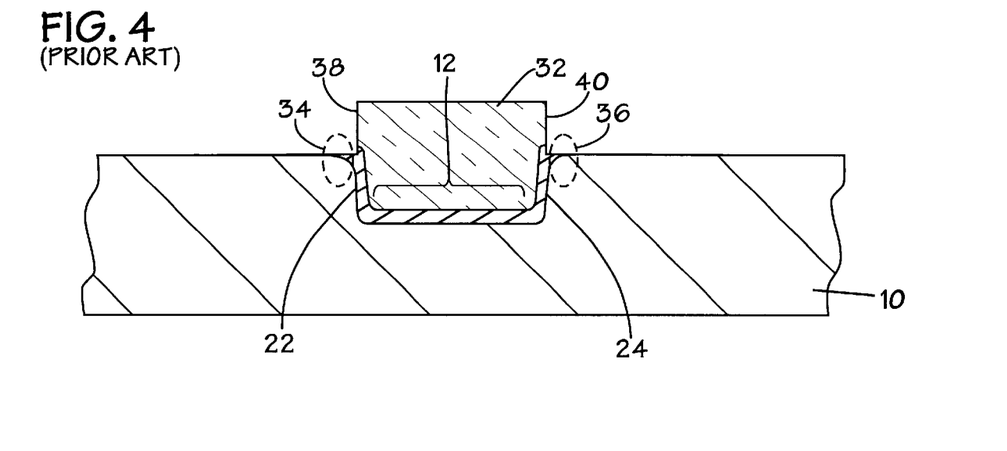

Referring now to FIG. 4, the silicon nitride layer 16 depicted in FIG. 3, as well as the pad oxide layer 14 are both stripped using a phosphoric acid hot dip and a plasma oxide strip. What remains is the isolation structure 32 positioned in the trench 12 and on the liner oxide layer 26. The oxidation process to fabricate the liner oxide layer 26 results in the formation of bird's beaks, which are delineated by the dashed ovals 34 and 36. These bird's beak structures 34 and 36 represent areas of extremely thin oxide protection over the underlying silicon substrate 10. These thin oxide structures 34 and 36 may be punched through during any of a multitude of subsequent dip cleans, oxide etches, sputter cleans and other processes. If the oxide structures 34 and 36 are compromised during any of these subsequent process steps, an electrical short pathway may be formed between the underlying substrate 10 and subsequently formed conducting structures, such as source/drain regions local interconnects or other conducting structures.

The presence of the unprotected bird's beak structures 34 and 36 is largely due to the fact that the edges 38 and 40 of the isolation structure 32 are pulled back from the sidewalls 22 and 24 of the underlying substrate 10. This is, in turn, due to the fact that the silicon nitride layer 16 (shown in FIG. 3)and used to establish the initial lateral dimension of the isolation structure 32 does not remain in vertical alignment with the sidewalls 22 and 24 of the substrate 10 during and following the formation of the liner oxide layer 26.

Figure 5:
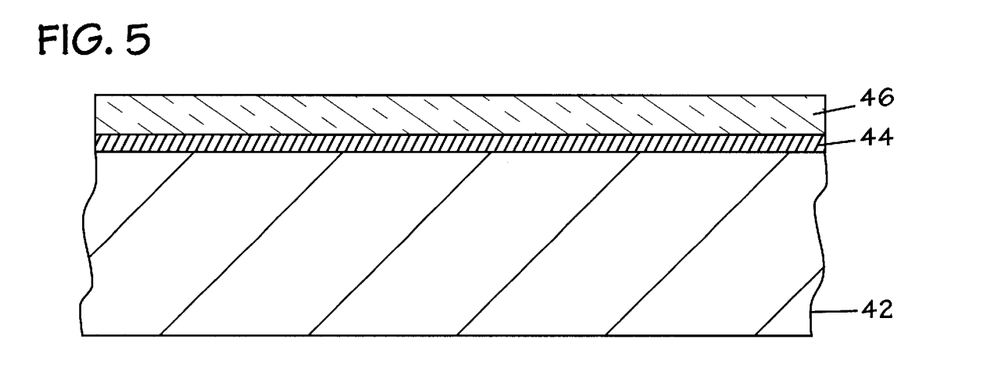
FIG. 5 depicts a cross-sectional view showing the fabrication of first and second insulating layers on a semiconductor substrate in accordance with the present invention.

An exemplary process flow in accordance with the present invention may be understood by referring now to FIGS. 5–8 and initially to FIG. 5. FIG. 5 depicts a crosssectional view of a portion of a semiconductor substrate 42 upon which a sacrificial oxide layer 44 is formed. As used herein, the terms "formed on", "disposed on" or "positioned on" should be construed to include the possibility that a given layer or structure may be formed on another given layer or structure with a third or other intervening layers or structures disposed between the two. The substrate 42 may be composed of n-doped, p-doped silicon or, silicon-on-insulator or other semiconductor substrate materials. The sacrificial oxide layer 44 may be about 100 to 300 Å in thickness and may be fabricated by well known thermal oxidation or CVD techniques. The sacrificial oxide layer 44 protects the underlying portions of the substrate 42 which will be used for active device regions in later processing from attack by various etching and cleaning processes.

An insulating layer 46 is fabricated on the oxide layer 44. As set forth below, the insulating layer 46 serves as a temporary protective layer to guard the underlying substrate 42 during subsequent isolation trench etch definition and thermal oxidation processes, and to act as a mold structure to set the initial lateral dimensions of a later formed isolation structure. In this illustrated embodiment, the insulating layer 46 is formed on the sacrificial oxide 44. Optionally, the insulating layer 46 may be formed directly on the substrate 42 and the sacrificial oxide layer 44 applied at a later stage.

The layer 46 is advantageously composed of a material or a combination of materials that densifies upon thermal treatment. The densification is the result of the outgassing or liberation of gas from, and the elimination of dangling bonds in the layer 46 during high temperature anneal. Exemplary materials include, for example, silicon oxynitride, plasma enhanced CVD ("PECVD"), silicon-rich nitride ($Si_xN_y$), PECVD silicon rich oxide ($Si_xO_y$) or the like. In an exemplary embodiment, the layer 46 is composed of silicon oxynitride and is deposited by well known PECVD techniques to a thickness of about 500 to 2000 Å, and advantageously to a thickness of about 1700 Å. The deposition conditions are selected so that the layer 46 is capable of the desired amount of densification during subsequent high temperature processing. In an exemplary embodiment, the insulating layer 46 will have a refractive index of about 1.8 to 2.1, a reflectivity of less than or equal to about 9% and a stress level of about $-1.3 \times 10^9$ to $-1.7 \times 10^9$ dynes/cm$^2$. The deposition rate may be about 1000 to 1400 Å/minute.

In an exemplary embodiment in accordance with the present invention, the deposition of the layer 46 is conducted at about 360 to 440° C. and advantageously at about 400° C. The silicon oxynitride may be deposited by exposing the substrate 42 to a mixture of silane, $N_2O$ and $N_2$ using PECVD. The deposition is carried out with about 100 to 120 sccm silane, about 110 to 140 sccm of $N_2O$ and about 7000 to 9000 sccm of $N_2$. In a tool capable of multiple Rf power settings, a high frequency Rf power setting of about 325 watts and a low frequency Rf power of about 0 watts are used. The pressure is about 2.4 to 2.8 torr. A preload of silane may be performed for about 0.25 to 0.5 seconds prior to application of Rf power. In addition, a temperature soak of 15 to 30 seconds may be used to stabilize the temperature prior to actual deposition.

The ultimate shrinkage or densification of the layer 46 after high temperature treatment may be controlled by separately or collectively manipulating the deposition temperature, the silane flow and the low frequency power. Experiment has shown that a lower deposition temperature results in a larger outgassing during high temperature treatment, and thus a greater shrinkage. Conversely, a higher temperature deposition will result in a relatively smaller amount of shrinkage during subsequent high temperature processing. In addition, both lower silane flow and higher low frequency Rf power during deposition decreases the initial film density and thus decreases the amount of shrinkage during heating.

Figure 6:
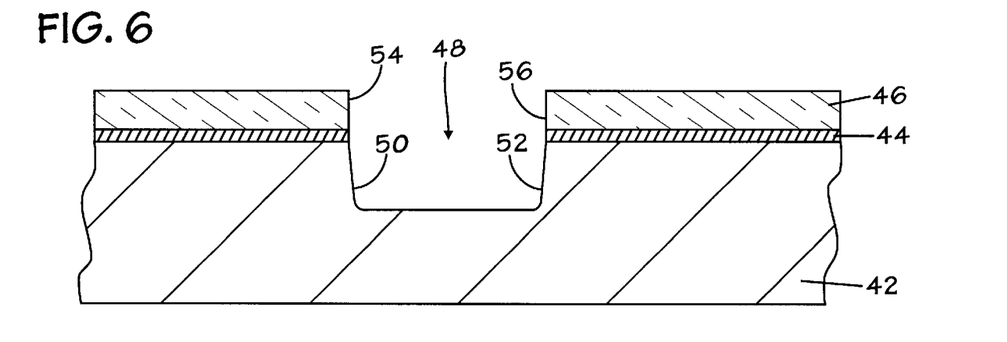
FIG. 6 depicts a cross-sectional view like FIG. 5 showing the etch definition of an isolation trench in the substrate in accordance with the present invention.

Referring now to FIG. 6, the insulating layer 46 is appropriately masked (not shown) and an anisotropic etch is performed to establish an isolation trench 48 in the substrate 42. In this exemplary embodiment, the insulating layer 46, the oxide layer 44 and the substrate 42 are sequentially anisotropically etched using chemistry appropriate for attacking those particular materials. For example, $CF_4/O_2$ may be used as the etchant species to penetrate the insulating layer 46, $CF_4/H_2$ may be used to etch the oxide layer 44, and $CF_4/O_2$ may be used to etch the substrate 42. The etch chemistry may be tailored so that the trench 48 is established with sloped sidewalls 50 and 52. The slope may be about 82° to 88°, some other slope angle, or may even be substantially vertical as desired. Following the etch to define the trench 48, there will be substantial vertical alignment between the sidewalls 50 and 52 and the respective sidewalls 54 and 56 of the insulating layer 46.

In this illustrated embodiment, the layers 44 and 46 are formed prior to definition of the trench 48. Optionally, the trench 48 may be formed first, and the layers 44 and 46 formed thereafter. In this alternative, the first-formed trench 48 could be masked during the formation of the layers 44 and 46.

Following the etch definition of the trench 48, the mask (not shown) is stripped by ashing or other well known resist stripping techniques. A wafer clean is then performed using a standard HF dip. The concentration may be 10:1, 100:1, 200:1 or other suitable concentration.

Figure 7:
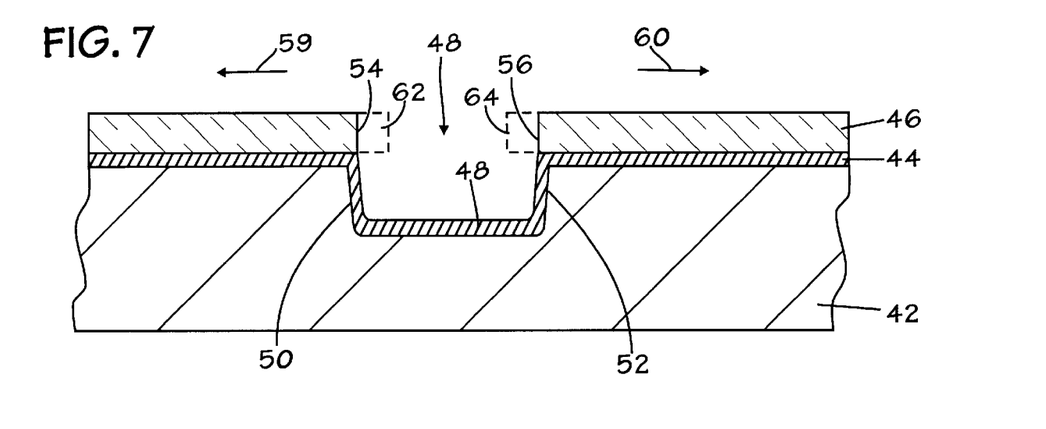
FIG. 7 depicts a cross-sectional view FIG. 6 showing the high temperature fabrication of a liner insulation layer in the trench and lateral shrinkage of the second insulating layer in accordance with the present invention.

Referring now to FIG. 7, a liner layer 58 of oxide is formed in the trench 48 by thermal oxidation. A mixture of HCl and $O_2$ is introduced at about 1050 to 1150° C. for about 60 to 90 second to establish the liner oxide layer 58 with a thickness of about 400 to 600 Å. The high temperature associated with the oxidation process causes outgassing of the layer 46. As the layer 46 outgasses, it densifies and shrinks both vertically and laterally, resulting in the lateral movement of the sidewalls 54 and 56 in the direction of the arrows 59 and 60. The former positions of the sidewalls 54 and 56 are represented by the dashed structures 62 and 64. Since the oxidation process to form the liner oxide 58 is consumptive of the underlying silicon 42, the sidewalls 50 and 52 of the trench 48 will also move laterally in the directions indicated by the respective arrows 59 and 60. Whereas in the conventional process, the lateral movement of the sidewalls 50 and 52 of the trench 48 would result in a vertical misalignment between those sidewalls 50 and 52 and the sidewalls 54 and 56 of the overlying insulating layer 46, the fabrication of the insulator layer 46 with the capacity to density through outgassing enables the maintenance of substantial vertical alignment between the sidewalls 54 and 56 and the underlying respective sidewalls 50 and 52.

Optionally, a separate heating step at about 1050 to 1150° C. may be used to densify the layer 46. In addition, another dielectric material may be used in lieu of oxide to fabricate the liner layer 58, such as silicon nitride, silicon oxynitride or other dielectric materials.

Figure 8:
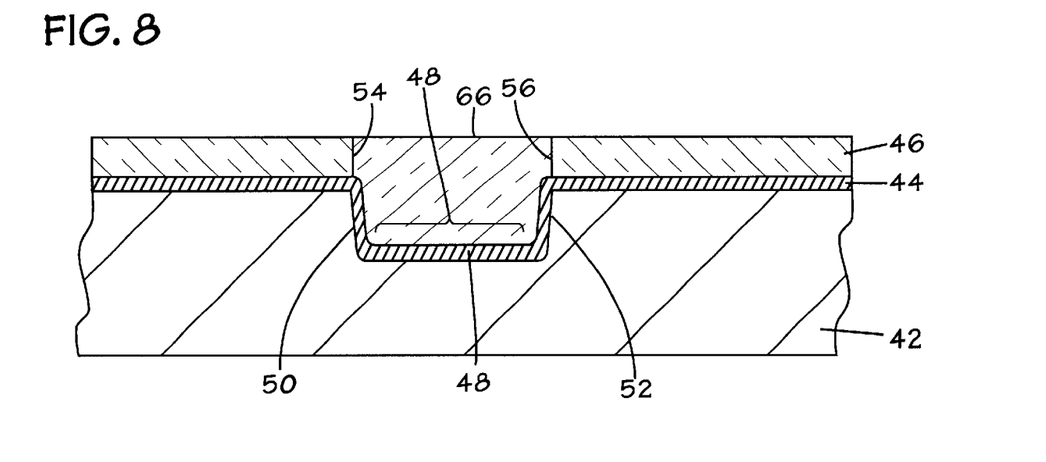
FIG. 8 is a cross sectional view like FIG. 7 depicting the fabrication of an isolation structure in the isolation trench in accordance with the present invention.
Figure 9:
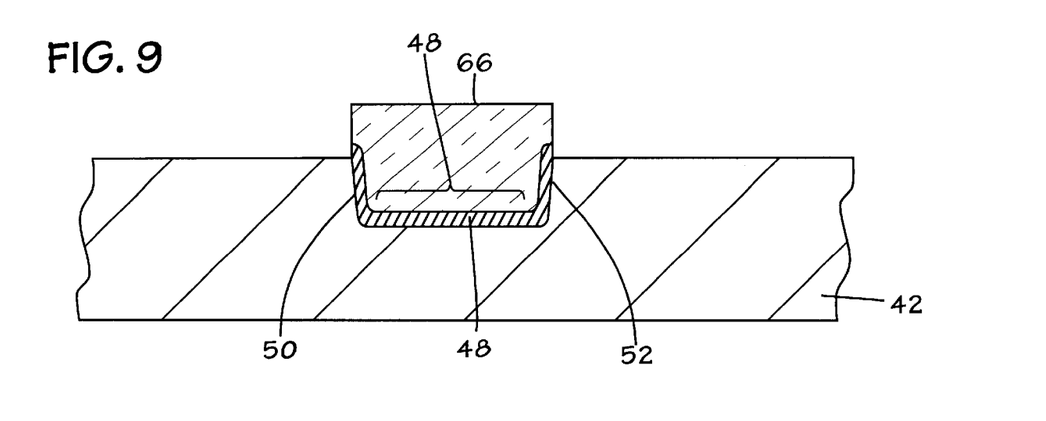
FIG. 9 is a cross sectional view like FIG. 8 depicting the removal of the first and second insulating layers from the substrate in accordance with the present invention.

Referring now to FIG. 8, an isolation structure 66 is fabricated in the trench 48 by blanket deposition of a suitable insulating material and subsequent planarization to the insulating layer 46. The isolation structure 66 may be composed of a variety of materials suitable for device isolation such as, for example, tetra-ethyl-ortho-silicate ("TEOS"), borophospho-silicate-glass, oxide, or the like. In an exemplary embodiment, the structure 66 is composed of TEOS and may be deposited using well known CVD techniques. The structure 66 may be planarized to the insulating layer 46 by CMP or other well known planarization techniques. Referring now also to FIG. 9, the insulating layer 46 depicted in FIG. 8 is stripped following planarization of the structure 66. A hot $H_3PO_4$ dip at about 80 to 150° C. or like process may be used. The sacrificial oxide layer 44 may also be stripped at this time using well known oxide stripping techniques or may be left in place in anticipation of later processing steps.

The ability of the insulating layer 46 to pull back through densification results in the subsequently formed isolation structure 66 being formed over and in substantial vertical alignment with the edges or sidewalls 50 and 52 of the trench 48. In this way, the troublesome structures 34 and 36 depicted in FIG. 4 are minimized in size and extent and covered by the relatively thick TEOS isolation structure 66. Thus, the edges 50 and 52 of the trench 48 are much more resistant to attack by subsequent HF dip cleans, oxide etches, sputter cleans and other processing steps that might otherwise result in attack of the underlying substrate 42 and ultimate electrical shorts.

The skilled artisan will appreciate the minimized pullback of the edges of the isolation tructure 66 from the sidewalls 50 and 52 will be realized so long as the sidewalls 54 and 56 of the layer 46 pullback at least into substantial vertical alignment with the sidewalls 50 and 52. However, the benefit of the present invention may also be realized so long as the sidewalls 54 and 56 move laterally away from the trench at least as far as the sidewalls 50 and 52.

As noted above, PECVD silicon-rich nitride ($Si_xN_y$) and PECVD silicon rich oxide ($Si_xO_y$) or the like may be used as alternative materials for the insulating layer 46. Silicon rich nitride ($Si_xN_y$) may be formed by introducing, for example, $NH_3$ into the plasma mix and silicon rich oxide ($Si_xO_y$) may be formed by introducing, for example, oxygen into the plasma mix. If the layer 46 is formed from a material that will be attacked by the planarization processed used to planarize the structure 66, then endpoint determination for the planarization should be carefully monitored and some topical removal of the layer 46 should be anticipated.

Figure 10:
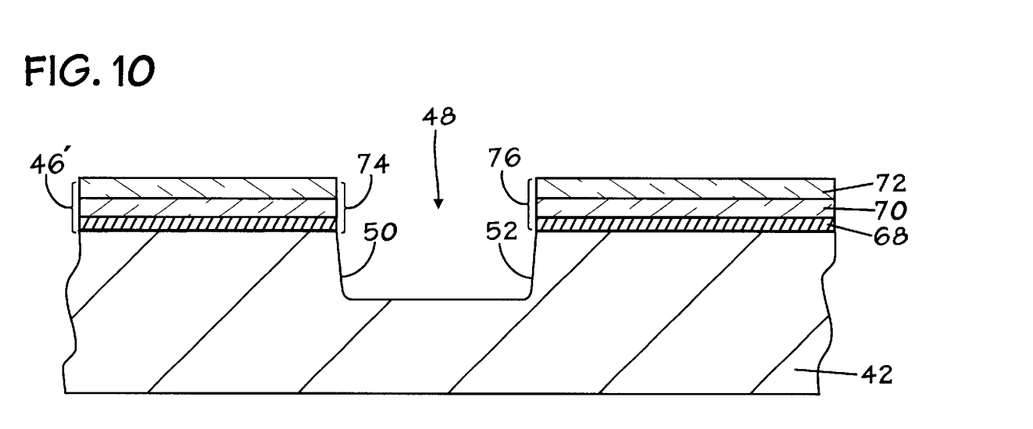
FIG. 10 is a cross sectional view like FIG. 6 depicting an alternate exemplary embodiment of the process in accordance with the present invention.

An alternate exemplary embodiment in accordance with the present invention may be understood by referring now to FIG. 10, which is a cross-sectional view like FIG. 6. In this alternate embodiment, the insulating layer, now designated 46', consists of a laminate structure of three insulating layers 68, 70 and 72. The layer 68 may be composed of silicon rich nitride, the layer 70 may be composed of silicon rich oxide and the layer 72 may be composed of silicon oxynitride. Considerable flexibility is envisioned for selecting the number of and materials for the component layers for the layer 46'. For example, the layer 68 may be silicon rich oxide, the layer 70 may be silicon oxynitride and the layer 72 may be silicon rich nitride. If only two layers are used, the layer 46' may consist of, for example, a layer 68 of silicon rich nitride and a layer 70 of silicon oxynitride. Where the layers 68, 70 and 72 have different shrink rates, the profiles of the sidewalls 74 and 76 may be stair-stepped following heat shrink. However, this will not adversely affect the performance of the process of the present invention.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating an isolation structure on a substrate, comprising:
   forming a first insulating layer on the substrate, the first insulating layer having a first sidewall;
   forming a trench in the substrate, the trench having a second sidewall;
   forming a second insulating layer in the trench, the second insulating layer displacing the second sidewall laterally; and
   densifying the first insulating layer by heating to liberate gas therefrom and thereby move the first sidewall into substantial vertical alignment with the second sidewall.

2. The method of claim 1, wherein the first insulating layer comprises silicon oxynitride.

3. The method of claim 2, wherein the gas comprises nitrogen and oxygen.

4. The method of claim 1, wherein the trench is formed in the substrate after the first insulating layer is formed, the formation of the trench resulting in an opening being formed in the first insulating layer.

5. The method of claim 1, comprising forming a third insulating layer on the second insulating layer.

6. The method of claim 5, comprising planarizing the third insulating layer to the first insulating layer and removing the first insulating layer.

7. The method of claim 1, comprising forming a fourth insulating layer between the substrate and the first insulating layer.

8. The method of claim 7, wherein the fourth insulating layer comprises an oxide layer.

9. The method of claim 1, wherein the second insulating layer comprises oxide or silicon nitride.

10. The method of claim 1, wherein the second insulating layer is formed by thermally oxidizing the substrate.

11. The method of claim 1, wherein the first insulating layer is heated and the second insulating layer is formed by thermally oxidizing the substrate.

12. A method of fabricating an isolation structure on a substrate, comprising:
    forming a first insulating layer on the substrate, the first insulating layer having a first sidewall;
    forming a trench in the substrate, the trench having a second sidewall;
    forming a first oxide layer in the trench, the first oxide layer displacing the second sidewall laterally; and
    densifying the first insulating layer by heating to liberate gas therefrom and thereby move the first sidewall laterally away from the trench and at least as far as the second sidewall.

13. The method of claim 12, wherein the first insulating layer comprises silicon oxynitride.

14. The method of claim 13, wherein the gas comprises nitrogen and oxygen.

15. The method of claim 12, wherein the trench is formed in the substrate after the first insulating layer is formed, the formation of the trench resulting in an opening being formed in the first insulating layer.

16. The method of claim 12, comprising forming a third insulating layer on the first oxide layer.

17. The method of claim 16, wherein the third insulating layer comprises TEOS.

18. The method of claim 16, comprising planarizing the third insulating layer to the first insulating layer and removing the first insulating layer.

19. The method of claim 12, comprising forming a fourth insulating layer between the substrate and the first insulating layer.

20. The method of claim 19, wherein the fourth insulating layer comprises a second oxide layer.

21. The method of claim 12, wherein the first oxide layer is formed by thermally oxidizing the substrate.

22. The method of claim 12, wherein the first insulating layer is heated and the first oxide is formed by thermally oxidizing the substrate.

23. A method of fabricating an isolation structure on a substrate, comprising:
    forming a silicon oxynitride layer on the substrate, the silicon oxynitride layer having a first sidewall;
    forming a trench in the substrate, the trench having a second sidewall;
    forming a first oxide layer in the trench, the first oxide layer displacing the second sidewall laterally; and densifying the silicon oxynitride layer by heating to liberate nitrogen and oxygen therefrom and thereby move the first sidewall into substantial vertical alignment with the second sidewall.

24. The method of claim 23, wherein the trench is formed in the substrate after the first insulating layer is formed, the formation of the trench resulting in an opening being formed in the first insulating layer.

25. The method of claim 23, comprising forming a third insulating layer on the second insulating layer.

26. The method of claim 25, wherein the third insulating layer comprises TEOS.

27. The method of claim 25, comprising planarizing the third insulating layer to the first insulating layer and removing the first insulating layer.

28. The method of claim 23, comprising forming a fourth insulating layer between the substrate and the first insulating layer.

29. The method of claim 27, wherein the fourth insulating layer comprises an oxide layer.

30. The method of claim 23, wherein the first oxide layer is formed by thermally oxidizing the substrate.

31. The method of claim 23, wherein the first insulating layer is heated and the first oxide layer is formed by thermally oxidizing the substrate.

* * * * *

UNITED STATES PATENT AND TRADEMARK OFFICE
CERTIFICATE OF CORRECTION

PATENT NO. : 6,265,283 B1
DATED : July 24, 2001
INVENTOR(S) : Homi Nariman et al.

It is certified that error appears in the above-identified patent and that said Letters Patent is hereby corrected as shown below:

Column 3,
Line 14, insert -- like -- between "view" and "FIG. 6";

Column 7,
Line 5, delete "tructure" and substitute -- structure -- therefor;

Column 8,
Line 57, insert -- layer -- after "oxide"; and

Column 10,
Line 4, delete "27" and substitute -- 28 -- therefor.

Signed and Sealed this

Fourteenth Day of October, 2003

JAMES E. ROGAN
*Director of the United States Patent and Trademark Office*